(12) United States Patent
Nago et al.

(10) Patent No.: US 9,130,069 B2
(45) Date of Patent: Sep. 8, 2015

(54) METHOD FOR MANUFACTURING NITRIDE SEMICONDUCTOR LAYER AND METHOD FOR MANUFACTURING SEMICONDUCTOR LIGHT EMITTING DEVICE

(71) Applicant: Kabushiki Kaisha Toshiba, Tokyo (JP)

(72) Inventors: Hajime Nago, Kanagawa-ken (JP); Yoshiyuki Harada, Tokyo (JP); Hisashi Yoshida, Kanagawa-ken (JP); Shigeya Kimura, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 286 days.

(21) Appl. No.: 13/798,436

(22) Filed: Mar. 13, 2013

(65) Prior Publication Data

US 2014/0045289 A1     Feb. 13, 2014

(30) Foreign Application Priority Data

Aug. 13, 2012   (JP) ................................. 2012-179532

(51) Int. Cl.
  *H01L 21/04*       (2006.01)
  *H01L 33/00*       (2010.01)
  (Continued)

(52) U.S. Cl.
  CPC .......... *H01L 33/0075* (2013.01); *C23C 16/301* (2013.01); *C23C 16/45523* (2013.01);
  (Continued)

(58) Field of Classification Search
  CPC .............. H01L 21/0257; H01L 21/041; H01L 21/0455; H01L 21/02126; H01L 21/38; H01L 21/2822; H01L 21/02312; H01L 21/02389; H01L 21/02573; H01L 29/24; H01L 29/207; H01L 2924/01001; H01L 2924/01007; H01L 2924/01031; H01L 51/5296; C30B 25/10; C30B 29/406; C30B 29/42; C30B 31/12

USPC ......... 438/510, 514, 508, 509, 521, 518, 535, 438/474, 475, 602, 603, 604, 931, 621, 905, 438/775, 766; 257/E21.006, E21.042, 257/E21.043, E21.055, E21.056, E21.057, 257/E21.126, E21.127, E21.142, E21.143, 257/E21.152, E21.155, E21.17, E21.135, 257/E21.274, E21.311, E21.324, E21.347

See application file for complete search history.

(56) References Cited

U.S. PATENT DOCUMENTS 7,655,491 B2 *   2/2010  Miki et al. ....................... 438/46
8,716,047 B2 *   5/2014  Goshonoo et al. .............. 438/46
(Continued)

FOREIGN PATENT DOCUMENTS

| JP | 2001-119066 A | 4/2001 |
|---|---|---|
| JP | 2009-231591 | 10/2009 |
| JP | 2011-119374 A | 6/2011 |
| JP | 2011-171431 A | 9/2011 |

OTHER PUBLICATIONS

Japanese Office Action Issued May 29, 2013 in Patent Application No. 2012-179532 (with English translation).

*Primary Examiner* — David Nhu

(74) *Attorney, Agent, or Firm* — Oblon, McClelland, Maier & Neustadt, L.L.P.

(57) ABSTRACT

According to one embodiment, a method is disclosed for manufacturing a nitride semiconductor layer. The method can include forming a first nitride semiconductor layer on a substrate in a reactor supplied with a first carrier gas and a first source gas. The first nitride semiconductor layer includes indium. The first carrier gas includes hydrogen supplied into the reactor at a first flow rate and includes nitrogen supplied into the reactor at a second flow rate. The first source gas includes indium and nitrogen and supplied into the reactor at a third flow rate. The first flow rate is not less than 0.07% and not more than 0.15% of a sum of the first flow rate, the second flow rate, and the third flow rate.

22 Claims, 10 Drawing Sheets

(51) Int. Cl.
  *H01L 21/02* (2006.01)
  *H01L 33/06* (2010.01)
  *C23C 16/30* (2006.01)
  *C23C 16/455* (2006.01)

(52) U.S. Cl.
  CPC ........ *H01L21/0254* (2013.01); *H01L 21/0262* (2013.01); *H01L 21/02458* (2013.01); *H01L 21/02507* (2013.01); *H01L 21/02576* (2013.01); *H01L 21/02579* (2013.01); *H01L 33/007* (2013.01); *H01L 33/06* (2013.01)

(56) References Cited

U.S. PATENT DOCUMENTS

| | | | |
|---|---|---|---|
| 8,765,507 B2 * | 7/2014 | Yokoyama et al. | 438/45 |
| 8,785,227 B2 * | 7/2014 | Sakai | 438/46 |
| 8,900,489 B2 * | 12/2014 | Taylor et al. | 257/103 |
| 2011/0197808 A1 | 8/2011 | Shioda et al. | |
| 2013/0048942 A1 * | 2/2013 | Konno et al. | 257/13 |

* cited by examiner

METHOD FOR MANUFACTURING NITRIDE SEMICONDUCTOR LAYER AND METHOD FOR MANUFACTURING SEMICONDUCTOR LIGHT EMITTING DEVICE

CROSS-REFERENCE TO RELATED APPLICATIONS

This application is based upon and claims the benefit of priority from the prior Japanese Patent Application No. 2012-179532, filed on Aug. 13, 2012; the entire contents of which are incorporated herein by reference.

FIELD

Embodiments described herein relate generally to a method for manufacturing nitride semiconductor layer and a method for manufacturing semiconductor light emitting device.

BACKGROUND

There is a nitride semiconductor layer including In. The nitride semiconductor layer including In is used as, for example, a quantum well layer (hereinafter, referred to as a well layer) in a semiconductor light emitting device such as a light emitting diode and a laser diode. In the nitride semiconductor layer used for a semiconductor light emitting device, the crystal quality of the well layer is very important in order to improve the light emission efficiency. However, technology for forming a well layer of high quality has not yet been established. For the present, the nitride semiconductor layer including In has the problem of segregation of In. For example, a region of the well layer where the composition ratio of In is high is weak in thermal stability, and may form a starting point of a crystal defect such as a phase separation and reduce the light emission efficiency. Technology for manufacturing a nitride semiconductor layer of high crystal quality which provides a well layer with high light emission efficiency is desired.

DETAILED DESCRIPTION

Figure 1:
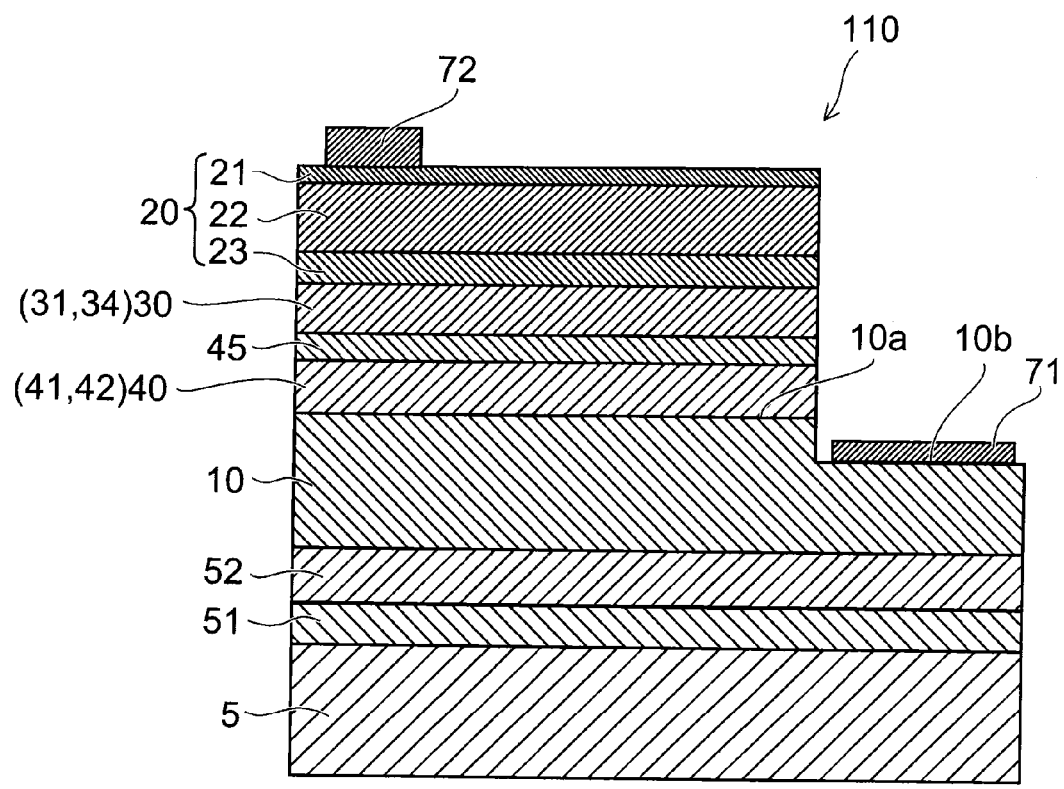
FIG. 1 is a schematic cross-sectional view illustrating a semiconductor light emitting device according to an embodiment.

According to one embodiment, a method is disclosed for manufacturing a nitride semiconductor layer. The method can include forming a first nitride semiconductor layer on a substrate in a reactor supplied with a first carrier gas and a first source gas. The first nitride semiconductor layer includes indium. The first carrier gas includes hydrogen being supplied into the reactor at a first flow rate and includes nitrogen being supplied into the reactor at a second flow rate. The first source gas includes indium and nitrogen being supplied into the reactor at a third flow rate. The first flow rate is not less than 0.07% and not more than 0.15% of a sum of the first flow rate, the second flow rate, and the third flow rate.

According to another embodiment, a method is disclosed for manufacturing a semiconductor light emitting device. The method can include forming a light emitting layer on a first semiconductor layer of a first conductivity type in a reactor. The first semiconductor layer includes a nitride semiconductor. The forming the light emitting layer includes forming a stacked unit. The stacked unit includes a well layer and a first barrier layer. The well layer includes $In_\alpha Ga_{1-\alpha}N$ ($0<\alpha<1$). The first barrier layer includes $In_{\beta 1}Ga_{1-\beta 1}N$ ($0 \leq \beta 1<1$, $\beta 1<\alpha$). The forming the stacked unit includes forming the well layer by a first carrier gas and a first source gas. The first carrier gas includes hydrogen being supplied into the reactor at a first flow rate and includes nitrogen being supplied into the reactor at a second flow rate. The first source gas includes indium, gallium, and nitrogen being supplied into the reactor at a third flow rate. The first flow rate is not less than 0.07% and not more than 0.15% of a sum of the first flow rate, the second flow rate, and the third flow rate. The method can include forming a second semiconductor layer on the light emitting layer. The second semiconductor layer is of a second conductivity type and includes a nitride semiconductor.

Various embodiments will be described hereinafter with reference to the accompanying drawings.

The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

FIG. 1 is a schematic cross-sectional view illustrating a semiconductor light emitting device according to an embodiment.

Figure 2:
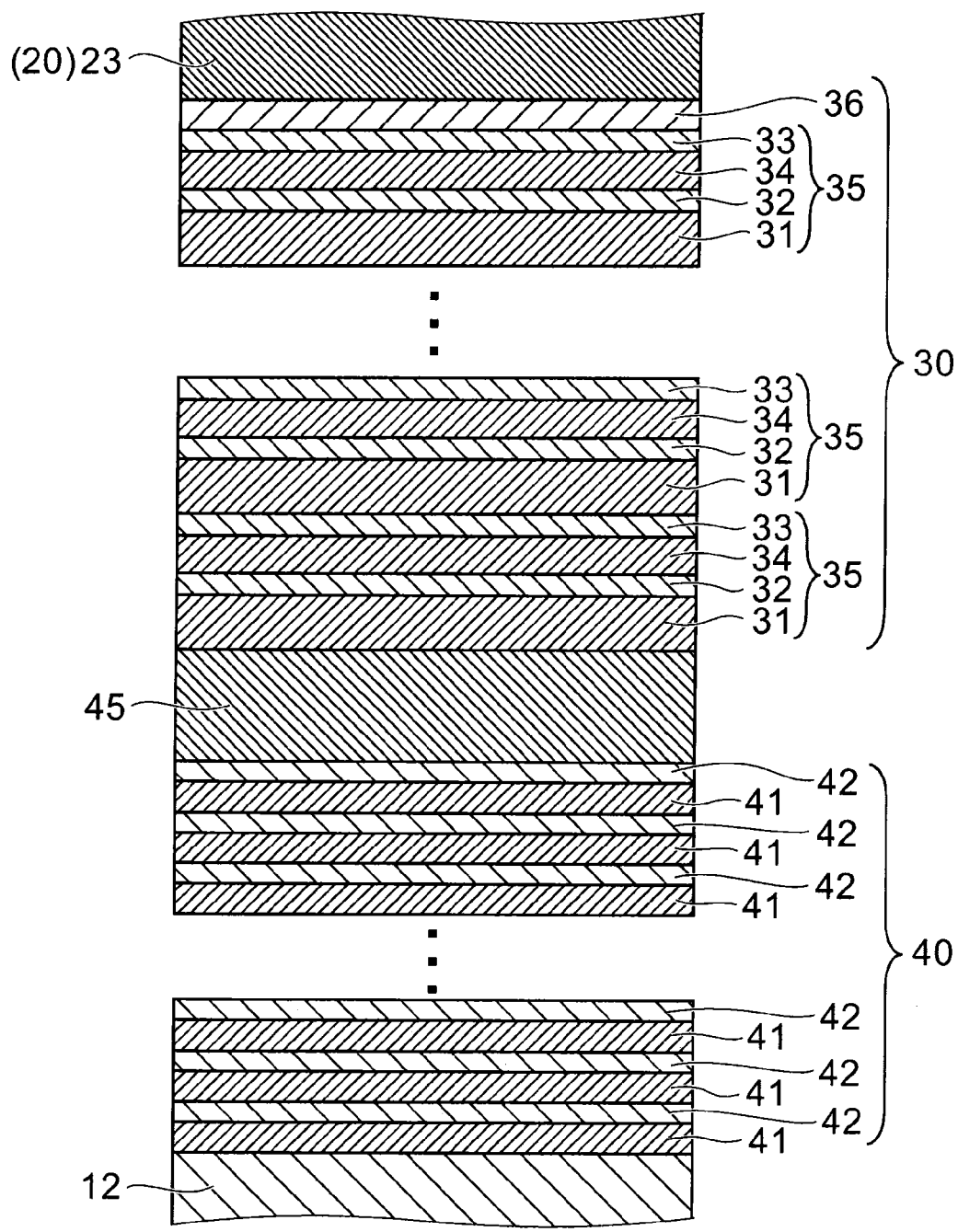
FIG. 2 is a schematic cross-sectional view illustrating a part of the semiconductor light emitting device according to the embodiment.

FIG. 2 is a schematic cross-sectional view illustrating a part of the semiconductor light emitting device according to the embodiment.

As shown in FIG. 1, a semiconductor light emitting device 110 according to the embodiment includes a first semiconductor layer 10, a light emitting layer 30, and a second semiconductor layer 20.

The first semiconductor layer 10 includes a nitride semiconductor, and is a first conductivity type. The first conductivity type is the n type, and a second conductivity type is the p type. The first conductivity type may also be the p type, and the second conductivity type may also be the n type. In the following, a description is given on the assumption that the first conductivity type is the n type and the second conductivity type is the p type. A GaN layer including an n-type impurity, for example, is used as the first semiconductor layer 10. Si, for example, is used as the n-type impurity of the first semiconductor layer 10. The first semiconductor layer 10 is called also an n-type GaN contact layer, for example.

The light emitting layer 30 is provided above the first semiconductor layer 10.

The second semiconductor layer 20 is provided on the light emitting layer 30. The second semiconductor layer 20 includes a nitride semiconductor, and is the second conductivity type. A voltage is applied between the first semiconductor layer 10 and the second semiconductor layer 20 to pass a current through the light emitting layer 30. Thereby, light is emitted from the light emitting layer 30.

The second semiconductor layer 20 includes, for example, a first p-type layer 21 (a third layer), a second p-type layer 22 (a second layer), and a third p-type layer 23 (a first layer). A GaN layer including a p-type impurity, for example, is used as the first p-type layer 21. The first p-type layer 21 is called also a p-type GaN contact layer, for example. The second p-type layer 22 is provided between the first p-type layer 21 and the light emitting layer 30. A GaN layer including a p-type impurity, for example, is used as the second p-type layer 22. The concentration of the p-type impurity of the second p-type layer 22 is lower than the concentration of the p-type impurity of the first p-type layer 21. The third p-type layer 23 is provided between the second p-type layer 22 and the light emitting layer 30. An AlGaN layer including a p-type impurity, for example, is used as the third p-type layer 23. That is, the lattice constant of the third p-type layer 23 is smaller than the lattice constant of the second p-type layer 22. Mg, for example, is used as the p-type impurity of the second semiconductor layer 20. The second p-type layer 22 and the third p-type layer 23 are appropriately provided as necessary, and may be omitted. That is, the second semiconductor layer 20 may be only the first p-type layer 21.

Here, the stacking direction of the first semiconductor layer 10 and the second semiconductor layer 20 is defined as the Z-axis direction. The Z-axis direction is the direction perpendicular to the film surface of the first semiconductor layer 10. One direction perpendicular to the Z-axis direction is defined as the X-axis direction. The direction perpendicular to the Z-axis direction and the X-axis direction is defined as the Y-axis direction.

In this example, the semiconductor light emitting device 110 further includes a substrate 5, a first buffer layer 51, a second buffer layer 52, a stacked film 40, an intermediate layer 45, a first electrode 71, and a second electrode 72.

At least one of a sapphire substrate, a SiC substrate, a GaN substrate, and a Si substrate, for example, is used as the substrate 5. The first semiconductor layer 10 is provided between the substrate 5 and the light emitting layer 30. That is, the first semiconductor layer 10 is provided on the substrate 5.

The first buffer layer 51 is provided between the substrate 5 and the first semiconductor layer 10. An AlGaN layer, for example, is used as the first buffer layer 51. The second buffer layer 52 is provided between the first buffer layer 51 and the first semiconductor layer 10. A non-doped GaN layer, for example, is used as the second buffer layer 52. The lattice constant of the second buffer layer 52 is larger than the lattice constant of the first buffer layer 51. The second buffer layer 52 is called also a GaN underlayer, for example.

The stacked film 40 is provided between the first semiconductor layer 10 and the light emitting layer 30. The intermediate layer 45 is provided between the stacked film 40 and the light emitting layer 30. A GaN layer including an n-type impurity, for example, is used as the intermediate layer 45. Si, for example, is used as the n-type impurity of the intermediate layer 45.

The first electrode 71 is electrically connected to the first semiconductor layer 10. A stacked body of a Ti film/a Pt film/an Au film, for example, is used as the first electrode 71. The second electrode 72 is electrically connected to the second semiconductor layer 20. In this example, the second electrode 72 is electrically connected to the first p-type layer 21. A stacked body of a Ni film/an Au film, for example, is used as the second electrode 72.

The first semiconductor layer 10 includes a first portion 10a and a second portion 10b. The second portion 10b is aligned with the first portion 10a in a direction (e.g. the X-axis direction) along the X-Y plane. The second portion 10b is, for example, adjacent to the first portion 10a. The stacked film 40, the intermediate layer 45, the light emitting layer 30, and the second semiconductor layer 20 are provided on the first portion 10a. The first electrode 71 is provided on the second portion 10b. That is, the area of the first semiconductor layer 10 when projected onto the X-Y plane is larger than the area of the second semiconductor layer 20 when projected onto the X-Y plane.

As shown in FIG. 2, the light emitting layer 30 includes stacked units 35 and a cap layer 36. In this example, a plurality of stacked units 35 are provided. The plurality of stacked units 35 are stacked along the Z-axis direction. The number of stacked units 35 is, for example, eight. The number of stacked units 35 may also be 7 or less or 9 or more. The cap layer 36 is provided on the stacked unit 35 located on the uppermost side. A GaN layer, for example is used as the cap layer 36.

One stacked unit 35 includes a first barrier layer 31 (a second nitride semiconductor layer) and a well layer 34 (a first nitride semiconductor layer).

In this example, one stacked unit 35 further includes a second barrier layer 32 and a third barrier layer 33. In the stacked unit 35, the first barrier layer 31, the second barrier layer 32, the well layer 34, and the third barrier layer 33 are stacked in this order along the Z-axis direction. The second barrier layer 32 is provided on the first barrier layer 31, the well layer 34 is provided on the second barrier layer 32, and the third barrier layer 33 is provided on the well layer 34.

The well layer 34 includes, for example, $In_\alpha Ga_{1-\alpha}N$ ($0<\alpha<1$). The first barrier layer 31 includes, for example, $In_{\beta 1}Ga_{1-\beta 1}N$ ($0\le\beta 1<1$, $\beta 1<\alpha$). The second barrier layer 32 includes, for example, $In_{\beta 2}Ga_{1-\beta 2}N$ ($0\le\beta 2<1$, $\beta 2<\alpha$). The third barrier layer 33 includes, for example, $In_{\beta 3}Ga_{1-\beta 3}N$ ($0\le\beta 3<1$, $\beta 3<\alpha$). The composition ratio $\beta 1$ is preferably 0.1 or less. Thereby, the relaxation of lattice distortion can be suppressed. A non-doped GaN layer, for example, is used as the first barrier layer 31, the second barrier layer 32, and the third barrier layer 33. An InGaN layer, for example, is used as the well layer 34. The composition ratio $\alpha$ of In of the well layer 34 is, for example, 0.15 (not less than 0.10 and not more than 0.20). The second barrier layer 32 and the third barrier layer 33 are appropriately provided as necessary, and may be omitted. In this case, a plurality of first barrier layers 31 and a plurality of well layers 34 are alternately stacked along the Z-axis direction.

In this example, the light emitting layer 30 is an MQW (multi-quantum well) structure in which a plurality of first barrier layers 31 and a plurality of well layers 34 are alternately stacked along the Z-axis direction. The light emitting layer 30 may be also an SQW (single-quantum well) structure. That is, the first barrier layer 31 and the well layer 34 may each be one in number. The stacked unit 35 may also be one in number.

The stacked film 40 includes a plurality of first layers 41 and a plurality of second layers 42. The plurality of first layers 41 and the plurality of second layers 42 are alternately aligned along the Z-axis direction. The band gap energy of each of the plurality of first layers 41 is higher than the band gap energy of each of the plurality of second layers 42. The stacked film 40 is, for example, a superlattice layer. A GaN layer, for example, is used as the plurality of first layers 41. The GaN layer of the plurality of first layers 41 includes, for example, an n-type impurity. Si, for example, is used as the n-type impurity of the plurality of first layers 41. An InGaN layer, for example, is used as the plurality of second layers 42. An $In_{0.08}Ga_{0.92}N$ layer, for example, is used as the plurality of second layers 42.

Next, a method for manufacturing the semiconductor light emitting device 110 is described.

In the following, the case is illustrated where metal organic chemical vapor deposition (MOCVD) is used. In the manufacturing of a semiconductor light emitting device according to the embodiment, any method used for growing a nitride semiconductor may be employed, such as, for example, hydride vapor phase epitaxy (HVPE) and molecular beam epitaxy (MBE).

Figure 3:
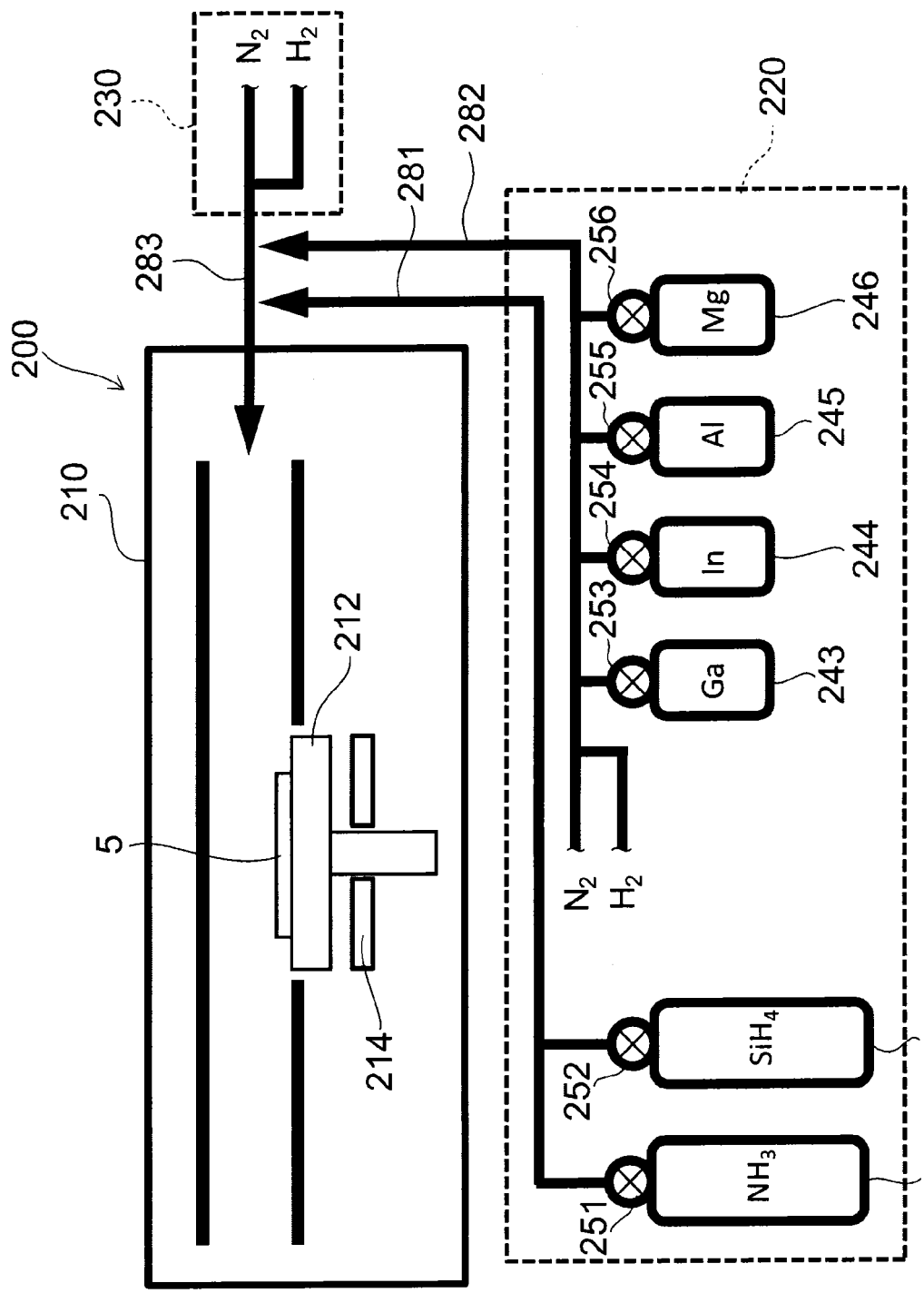
FIG. 3 is a schematic block diagram illustrating an MOCVD apparatus.

FIG. 3 is a schematic block diagram illustrating an MOCVD apparatus 200 (a semiconductor manufacturing apparatus).

As shown in FIG. 3, the MOCVD apparatus 200 includes a reactor 210, a source material supply unit 220, a carrier gas supply unit 230, and a first to a third pipes 281-283.

The reactor 210 includes a susceptor 212 and a heater 214. The susceptor 212 and the heater 214 are provided in the reactor 210.

The susceptor 212 is a support stand for supporting the substrate 5. The heater 214 controls a temperature of the susceptor 212.

The source material supply unit 220 includes a first to a sixth tanks 241-246 and a first to a sixth valves 251-256, for example.

The first tank 241 stores ammonia, for example. The first tank 241 is connected to the first pipe 281 via the first valve 251. The second tank 242 stores monosilane, for example. The second tank 242 is connected to the first pipe 281 via the second valve 252. The third tank 243 stores trimethylgallium, for example. The third tank 243 is connected to the second pipe 282 via the third valve 253. The fourth tank 244 stores trimethylindium, for example. The fourth tank 244 is connected to the second pipe 282 via the fourth valve 254. The fifth tank 245 stores trimethylaluminum, for example. The fifth tank 245 is connected to the second pipe 282 via the fifth valve 255. The sixth tank 246 stores cyclopentadienylmagnesium, for example. The sixth tank 246 is connected to the second pipe 282 via the sixth valve 256.

The source material supply unit 220 further includes a nitrogen generator and a hydrogen generator (not shown). The nitrogen generator and the hydrogen generator are connected to the second pipe 282.

The carrier gas supply unit 230 includes a nitrogen generator and a hydrogen generator (not shown). The nitrogen generator and the hydrogen generator are connected to the third pipe 283.

The first to the third pipes 281-283 are connected to the reactor 210. Thus, each gasses stored in the first to the sixth tanks 241-246 are supplied into the reactor 210 at a predetermined flow rate according to adjustment of opening and closing of the first to the sixth valves 251-256. Then, nitrogen gas and hydrogen gas are supplied from each generator into the reactor 210 at a predetermined flow rate.

As the source material of Ga, for example, trimethylgallium (TMGa), triethylgallium (TEGa), and the like are used. As the source material of In, for example, trimethylindium (TMIn) is used. As the source material of Al, for example, trimethylaluminum (TMAl) is used. As the source material of N, for example, ammonia ($NH_3$) is used. As the source material of Si, for example, monosilane ($SiH_4$) is used. As the source material of Mg, for example, cyclopentadienylmagnesium ($Cp_2Mg$) is used. TMGa, TEGa, TMIn, TMAl, $NH_3$, $SiH_4$, and $Cp_2Mg$ are used as gaseous materials. The source materials are not limited to the above, and any material that can manufacture the configuration of the semiconductor light emitting device according to the embodiment can be used. Nitrogen and hydrogen, for example, are used as a carrier gas.

In the manufacturing of the semiconductor light emitting device 110, first, the substrate 5 is set on the susceptor 212 provided in the reactor 210 of the MOCVD apparatus 200. A sapphire substrate is used as the substrate 5. Hydrogen is supplied as a carrier gas, and the temperature of the susceptor 212 is set to 1160° C.; thereby, the thermal cleaning of the substrate 5 is performed in a hydrogen atmosphere.

After the temperature of the susceptor 212 is lowered to 530° C., hydrogen is supplied as a carrier gas, and TMGa, TMAl, and $NH_3$ are supplied as a source gas; thereby, an AlGaN layer is formed as the first buffer layer 51 on the substrate 5. The thickness (the thickness along the Z-axis direction) of the first buffer layer 51 is, for example, 20 (nanometers; nm). The thickness of the first buffer layer 51 is, for example, not less than 10 nm and not more than 30 nm.

After the temperature of the susceptor 212 is raised to 1140° C., hydrogen is supplied as a carrier gas, and TMGa and $NH_3$ are supplied as a source gas; thereby, a non-doped GaN layer is formed as the second buffer layer 52 on the first buffer layer 51. The thickness of the second buffer layer 52 is, for example, 3 μm (not less than 2 μm and not more than 5 μm).

By further supplying $SiH_4$ in addition to TMGa and $NH_3$, a GaN layer including Si is formed as the first semiconductor layer 10 on the second buffer layer 52. The thickness of the first semiconductor layer 10 is, for example, 4 μm (not less than 2 μm and not more than 5 μm). The growth temperature of the first semiconductor layer 10 is, for example, not less than 1100° C. and not more than 1200° C. In this example, the growth temperature is the temperature of the susceptor 212, for example. The growth temperature may be also the temperature of the substrate 5, the temperature of the gas around the substrate 5 (the ambient temperature), or the temperature of the film itself growing. The temperature of the substrate 5 and the temperature of the film growing can be measured by, for example, a non-contact temperature sensor utilizing infrared light or the like.

After the temperature of the susceptor 212 is lowered to 810° C., nitrogen is supplied as a carrier gas, and TMGa, $NH_3$, and $SiH_4$ are supplied as a source gas; thereby, a GaN layer including Si is formed as the first layer 41 on the first semiconductor layer 10. The thickness of the first layer 41 is, for example, 2 nm (not less than 1 nm and not more than 3 nm). Nitrogen is supplied as a carrier gas, and TMGa, TMIn, and $NH_3$ are supplied as a source gas; thereby, an $In_{0.08}Ga_{0.92}N$ layer is formed as the second layer 42 on the first layer 41. The thickness of the second layer 42 is, for example, 1 nm (not less than 0.5 nm and not more than 2 nm). The formation of the first layer 41 and the formation of the second layer 42 are repeated 30 times. Thereby, the stacked film 40 having a stacked structure in which the first layer 41 and the second layer 42 are stacked with 30 periods is formed on the first semiconductor layer 10.

After the temperature of the susceptor 212 is raised to 830° C., nitrogen is supplied as a carrier gas, and TMGa, NH$_3$, and SiH$_4$ are supplied as a source gas; thereby, a GaN layer including Si is formed as the intermediate layer 45 on the stacked film 40. The thickness of the intermediate layer 45 is, for example, 5 nm (not less than 3 nm and not more than 12 nm).

Eight layers of stacked units 35 are formed on the intermediate layer 45, and the cap layer 36 is formed on the stacked unit 35 of the eighth layer; thereby, the light emitting layer 30 having a stacked structure in which the first barrier layer 31 and the well layer 34 are stacked with eight periods is formed.

After the temperature of the susceptor 212 is raised to 1030° C., a mixed gas of nitrogen and hydrogen is supplied as a carrier gas, and TMGa, TMAl, Cp$_2$Mg, and NH$_3$ are supplied as a source gas; thereby, an AlGaN layer including Mg is formed as the third p-type layer 23 on the light emitting layer 30. The thickness of the third p-type layer 23 is, for example, 10 nm (not less than 5 nm and not more than 20 nm).

Keeping the temperature of the susceptor 212 at 1030° C., a mixed gas of nitrogen and hydrogen is supplied as a carrier gas, and TMGa, Cp$_2$Mg, and NH$_3$ are supplied as a source gas; thereby, a GaN layer including Mg is formed as the second p-type layer 22 on the third p-type layer 23. The thickness of the second p-type layer 22 is, for example, 100 nm (not less than 40 nm and not more than 150 nm). The Mg concentration of the second p-type layer 22 is, for example, $2 \times 10^{19}$ cm$^{-3}$.

After the second p-type layer 22 is formed, by increasing the amount of Cp$_2$Mg supplied, a GaN layer including high-concentration Mg is formed as the first p-type layer 21 on the second p-type layer 22. Thereby, the second semiconductor layer 20 in which the first p-type layer 21, the second p-type layer 22, and the third p-type layer 23 are stacked is formed on the light emitting layer 30. The thickness of the first p-type layer 21 is, for example, 10 nm (not less than 3 nm and not more than 15 nm). The Mg concentration of the first p-type layer 21 is, for example, $3 \times 10^{21}$ cm$^{-3}$. The growth temperature of the second semiconductor layer 20 is, for example, not less than 1000° C. and not more than 1100° C.

The substrate 5 is taken out of the MOCVD apparatus 200, and the substrate 5 is set in an etching apparatus such as an RIE (reactive ion etching) apparatus. Part of the second semiconductor layer 20, part of the light emitting layer 30, part of the intermediate layer 45, and part of the stacked film 40 are removed by etching to expose part of the first semiconductor layer 10, and thereby the first portion 10a and the second portion 10b of the first semiconductor layer 10 are formed. A stacked body of a Ti film/a Pt film/an Au film is formed as the first electrode 71 on the second portion 10b. A stacked body of a Ni film/an Au film is formed as the second electrode 72 on the first p-type layer 21.

Thus, the semiconductor light emitting device 110 illustrated in FIG. 1 is obtained.

Next, a method for manufacturing the light emitting layer 30 is further described.

FIG. 4A to FIG. 4D are timing charts illustrating a manufacturing sequence of the light emitting layer 30.

Figure 4A:
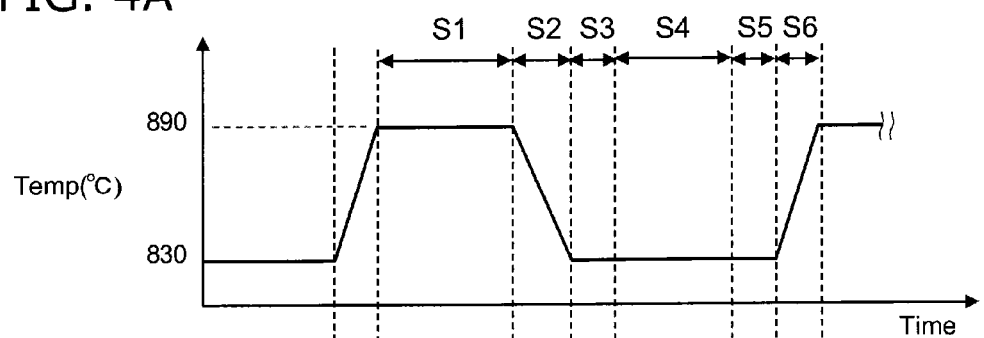
FIG. 4A to FIG. 4D are timing charts illustrating a manufacturing sequence of a light emitting layer.

The horizontal axis of FIG. 4A is time, and the vertical axis is the temperature (° C.) of the susceptor 212.

Figure 4B:
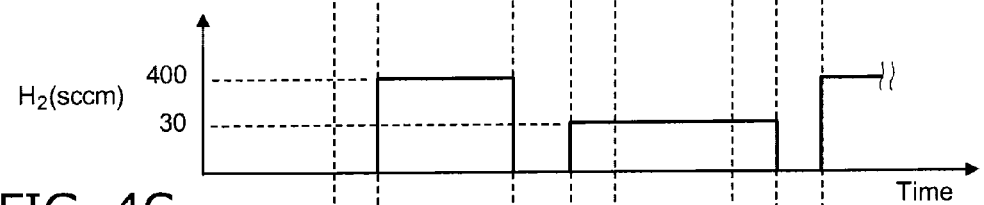

The horizontal axis of FIG. 4B is time, and the vertical axis is the flow rate (sccm; standard cc/minute) of hydrogen.

Figure 4C:
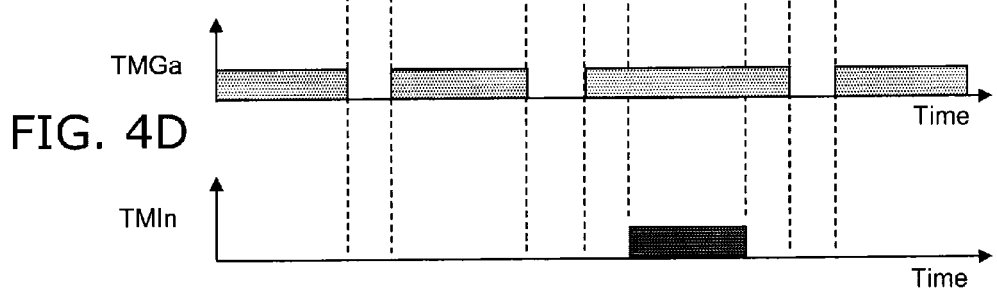

The horizontal axis of FIG. 4C is time, and the vertical axis is the flow rate of TMGa.

Figure 4D:
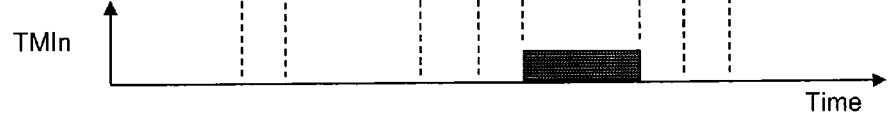
Figure 5A:
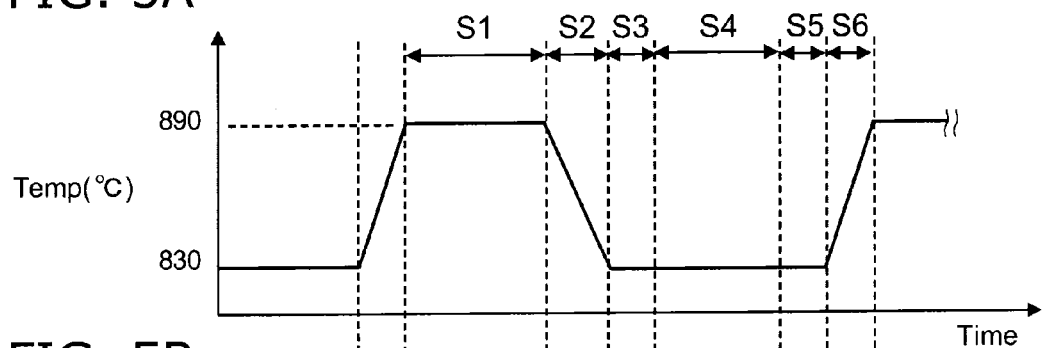
FIG. 5A to FIG. 5D are timing charts illustrating another manufacturing sequence of a light emitting layer.
Figure 5B:
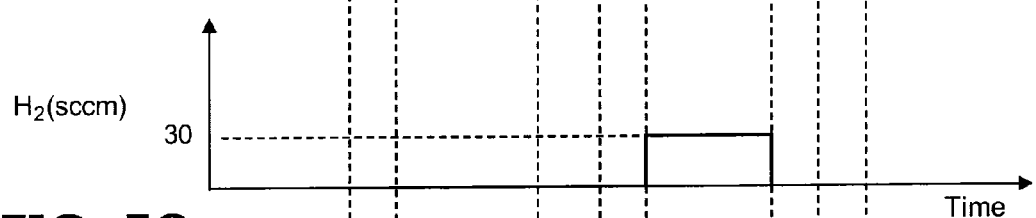
Figure 5C:
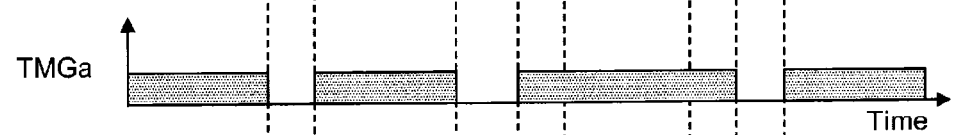
Figure 5D:

The horizontal axis of FIG. 4D is time, and the vertical axis is the flow rate of TMIn.

In the crystal growth of the light emitting layer 30, for example, the flow rate of nitrogen that is a carrier gas is set to 7000 sccm, the flow rate of NH$_3$ is set to 32,000 sccm, and the flow rate of the total gas supplied into the reactor 210 is kept at 39,000 sccm. NH$_3$ continues to be constantly supplied together with the carrier gas during the growth of the light emitting layer 30. Part of the nitrogen is supplied to a bubbler of TMGa, TMIn, etc. As the carrier gas, nitrogen which is an inert gas is preferable, but Ar, He, or the like may be used in place of nitrogen.

As shown in step S1 of FIG. 4A to FIG. 4D, the temperature of the susceptor 212 is set to 890° C. A carrier gas (a second carrier gas) in which hydrogen of 400 sccm is added to nitrogen is supplied, and TMGa of 8 sccm and NH$_3$ of 32,000 sccm are supplied as a source gas (a second source gas). Thereby, the first barrier layer 31 that is a GaN layer is grown with a thickness of 2.5 nm (not less than 1 nm and not more than 10 nm). At this time, the flow rate of nitrogen is decreased by an amount equivalent to the addition amount of hydrogen and TMGa so that the total flow rate (the total gas supply amount) may be 39,000 sccm. In this example, the flow rate of nitrogen is set to 6592 (=7000−408) sccm. That is, the first barrier layer 31 including In$_{\beta 1}$Ga$_{1-\beta 1}$N is formed by a carrier gas that includes hydrogen supplied into the reactor 210 at a flow rate of 400 sccm (a fourth flow rate) and nitrogen supplied into the reactor 210 at a flow rate of 6592 sccm (a fifth flow rate) and a source gas that includes TMGa and NH$_3$ and is supplied into the reactor 210 at a flow rate of 32,008 sccm (a sixth flow rate). The flow rate of hydrogen in the growth of the first barrier layer 31 is set not less than 0.2% and not more than 3% of the total flow rate, for example. In this example, the flow rate of hydrogen is 400 sccm, which is approximately 1% of the total flow rate, 39,000 sccm.

As shown in step S2, the crystal growth is suspended, and the temperature of the susceptor 212 is lowered to 830° C. Also in this case, the supply of NH$_3$ that is a source gas into the reactor 210 and the supply of nitrogen that is a carrier gas into the reactor 210 are continued throughout the time when the temperature of the susceptor 212 is lowered.

As shown in step S3, in a state where the temperature of the susceptor 212 is kept at 830° C., a mixed gas of nitrogen of 6970 sccm and hydrogen of 30 sccm is supplied as a carrier gas, and TMGa and NH$_3$ are supplied as a source gas. Thereby, the second barrier layer 32 that is a GaN layer is grown with a thickness of 0.5 nm (not less than 0.2 nm and not more than 1 nm).

As shown in step S4, TMIn is further supplied as a source gas, and thereby the well layer 34 that is an InGaN layer is grown with a thickness of 4 nm. That is, the well layer 34 including In$_\alpha$Ga$_{1-\alpha}$N is formed above the substrate 5 by a carrier gas (a first carrier gas) that includes hydrogen supplied into the reactor 210 at a flow rate of 30 sccm (a first flow rate) and nitrogen supplied into the reactor 210 at a flow rate of 6885 sccm (a second flow rate) and a source gas (a first source gas) that includes TMIn, TMGa, and NH$_3$ and is supplied into the reactor 210 at a flow rate of 32,085 sccm (a third flow rate). In this example, the well layer 34 is formed on the second barrier layer 32.

In the formation of the well layer 34, the flow rate of hydrogen is set not less than 0.07% and not more than 0.3% of the total flow rate. The flow rate of hydrogen is preferably set to 0.15% or less of the total flow rate (60 sccm or less). In this example, the flow rate of hydrogen is 0.077% of the total flow rate. In the formation of the well layer 34, the ratio of group III elements to group V elements (hereinafter, referred to as the V/III ratio) is set not less than 20,000 and not more than 30,000. In this example, the group V element is nitrogen, and the group III element is gallium and indium. That is, in this example, the V/III ratio is the ratio of TMGa and TMIn to $NH_3$. In this example, the V/III ratio is 20,300.

As shown in step S5, by suspending the supply of TMIn, the third barrier layer 33 that is a GaN layer is grown with a thickness of 2 nm (not less than 1 nm and not more than 3 nm) in a state where the temperature of the susceptor 212 is kept at 830° C. Thereby, one stacked unit 35 is obtained.

As shown in step S6, the temperature of the susceptor 212 is raised to 890° C. In step S6 in this example, the supply of TMGa is suspended, and the third barrier layer 33 is not grown. The third barrier layer 33 may also continue to be grown throughout the time when the temperature is raised in step S6.

After step S6, returning to step S1, the first barrier layer 31 of the stacked unit 35 of the second layer is formed on the well layer 34 of the stacked unit 35 of the first layer. The processes of step S1 to step S6 are repeated 8 times. Forming the well layer 34 and forming the first barrier layer 31 are alternately performed multiple times to alternately stack a plurality of well layers 34 and a plurality of first barrier layers 31. Thereby, eight layers of stacked units 35 are obtained.

In a state where the temperature of the susceptor 212 is set at 890° C., a mixed gas in which hydrogen of 400 sccm is added to nitrogen of 6592 sccm is supplied as a carrier gas, and TMGa and $NH_3$ are supplied as a source gas; thereby, the cap layer 36 that is a GaN layer is grown with a thickness of 3 nm (not less than 1 nm and not more than 5 nm) on the stacked unit 35 of the eighth layer.

Thus, the light emitting layer 30 is obtained.

FIG. 5A to FIG. 5D are timing charts illustrating another manufacturing sequence of the light emitting layer 30.

As shown in FIG. 5A to FIG. 5D, hydrogen may be supplied only in the formation of the well layer 34. That is, only nitrogen may be used as a carrier gas in the formation of the first barrier layer 31, the second barrier layer 32, and the third barrier layer 34. In the manufacturing sequence shown in FIG. 5A to FIG. 5D, the same manufacturing sequence as that shown in FIG. 4A to FIG. 4D may be used except that a carrier gas of only nitrogen is used in the formation of the first barrier layer 31, the second barrier layer 32, and the third barrier layer 33.

That is, this example includes a process in which the first barrier layer 31 (the second nitride semiconductor layer) including $In_{\beta1}Ga_{1-\beta1}N$ ($0 \le \beta1 < 1$, $\beta1 < \alpha$) is formed on the well layer 34 (the first nitride semiconductor layer) by the second carrier gas including nitrogen and the second source gas including at least gallium and nitrogen.

In the process that forms the first barrier layer 31, the supply of hydrogen to the second carrier gas is not performed.

In this process, the amount of hydrogen per unit volume included in the second carrier gas is smaller than the amount of hydrogen per unit volume included in the first carrier gas.

For example, the concentration of hydrogen per unit volume included in the second carrier gas is lower than the concentration of hydrogen per unit volume included in the first carrier gas.

For example, the amount of hydrogen per unit volume included in the second carrier gas is 1/10000 or less of the amount of hydrogen per unit volume included in the first carrier gas.

Next, an experiment conducted by the inventor of this application is described.

In the experiment, three samples of a first sample SP01 to a third sample SP03 are fabricated. The first sample SP01 is a sample of a first example fabricated by the manufacturing sequence of FIG. 4A to FIG. 4D. The second sample SP02 is a sample of a second example fabricated by the manufacturing sequence of FIG. 5A to FIG. 5D. The third sample SP03 is a sample of a reference example in which only nitrogen was used (hydrogen was not added) as the carrier gas in the formation of the first barrier layer 31, in the formation of the second barrier layer 32, in the formation of the third barrier layer 33, and in the formation of the well layer 34. In the third sample SP03, the manufacturing method and configuration except the components of the carrier gas in forming the light emitting layer 30 are substantially the same as the manufacturing method and configuration of the first sample SP01.

In the experiment, using the three-dimensional atom probe (3DAP) method, the composition ratio (concentration) of In in the light emitting layer 30 is measured for each of the first sample SP01 to the third sample SP03. Furthermore, in the experiment, photoluminescence (PL) measurement is performed for each of the first sample SP01 to the third sample SP03. The change in the PL half width to the PL peak wavelength and the relationship of the peak integrated intensity to the PL peak wavelength are investigated.

Figure 6A:
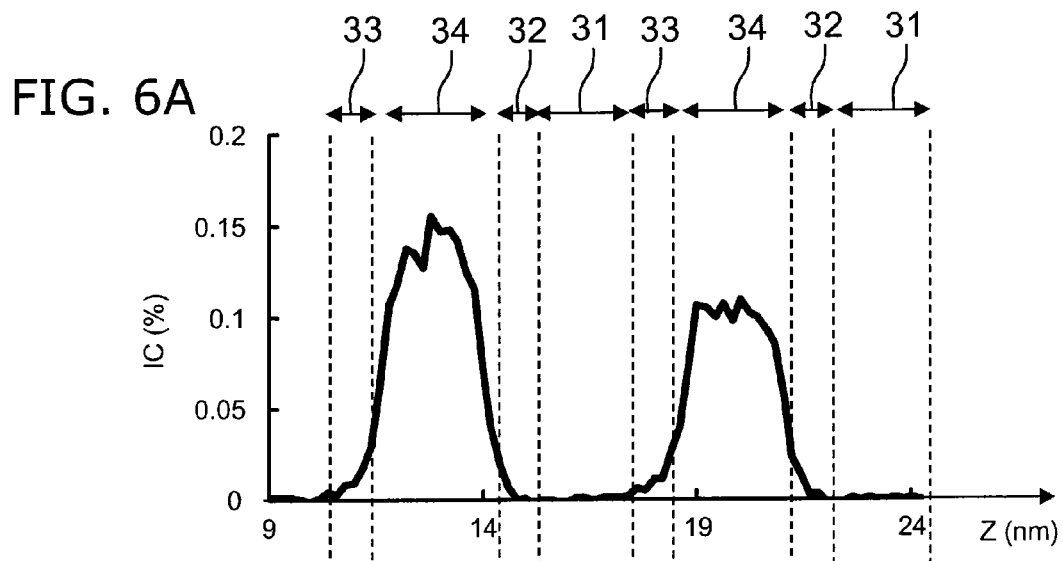
FIG. 6A to FIG. 6C are graphs illustrating characteristics of semiconductor light emitting devices.
Figure 6B:
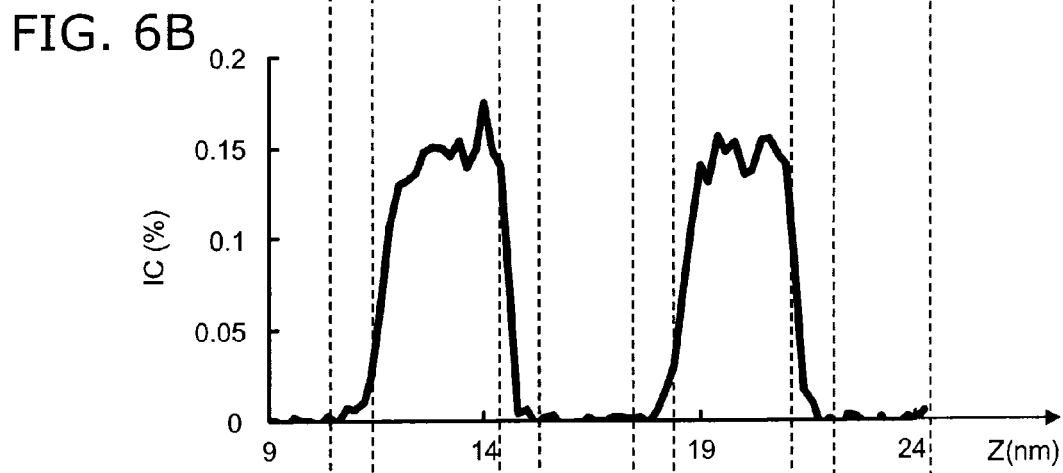
Figure 6C:
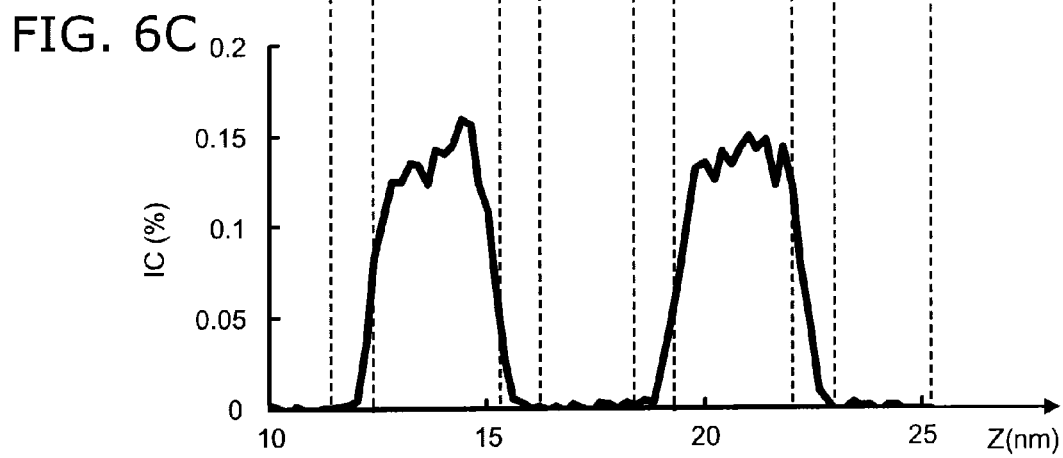

FIG. 6A to FIG. 6C are graphs illustrating characteristics of semiconductor light emitting devices.

FIG. 6A is the measurement results of the In composition ratio of the light emitting layer 30 of the first sample SP01. FIG. 6B is the measurement results of the In composition ratio of the light emitting layer 30 of the second sample SP02. FIG. 6C is the measurement results of the In composition ratio of the light emitting layer 30 of the third sample SP03.

In FIG. 6A to FIG. 6C, the horizontal axis is the position z (nm) in the Z-axis direction (the depth direction), and the vertical axis is the composition ratio IC (%) of In.

As shown in FIG. 6A, in the first sample SP01, the composition ratio IC of In changes near the interface between the second barrier layer 32 and the well layer 34 and near the interface between the third barrier layer 33 and the well layer 34. The In composition ratio IC is not steady along the Z-axis direction.

As shown in FIG. 6B, in the second sample SP02, the composition ratio IC of In changes more steeply than in the first sample SP01 near the interface between the second barrier layer 32 and the well layer 34 and near the interface between the third barrier layer 33 and the well layer 34.

As shown in FIG. 6C, in the third sample SP03, the composition ratio IC of In changes more gently than in the first sample SP01 and the second sample SP02 near the interface between the second barrier layer 32 and the well layer 34 and near the interface between the third barrier layer 33 and the well layer 34.

The rate of change (gradient) in the composition ratio IC of In in the well layer 34 of the first sample SP01 and the well layer 34 of the second sample SP02 is higher than the rate of change in the concentration of In in the well layer 34 of the third sample SP03. This means that the segregation of In of the well layer 34 in the first sample SP01 and the well layer 34 in the second sample SP02 is more suppressed than the segregation of In of the well layer 34 in the third sample SP03.

Figure 7:
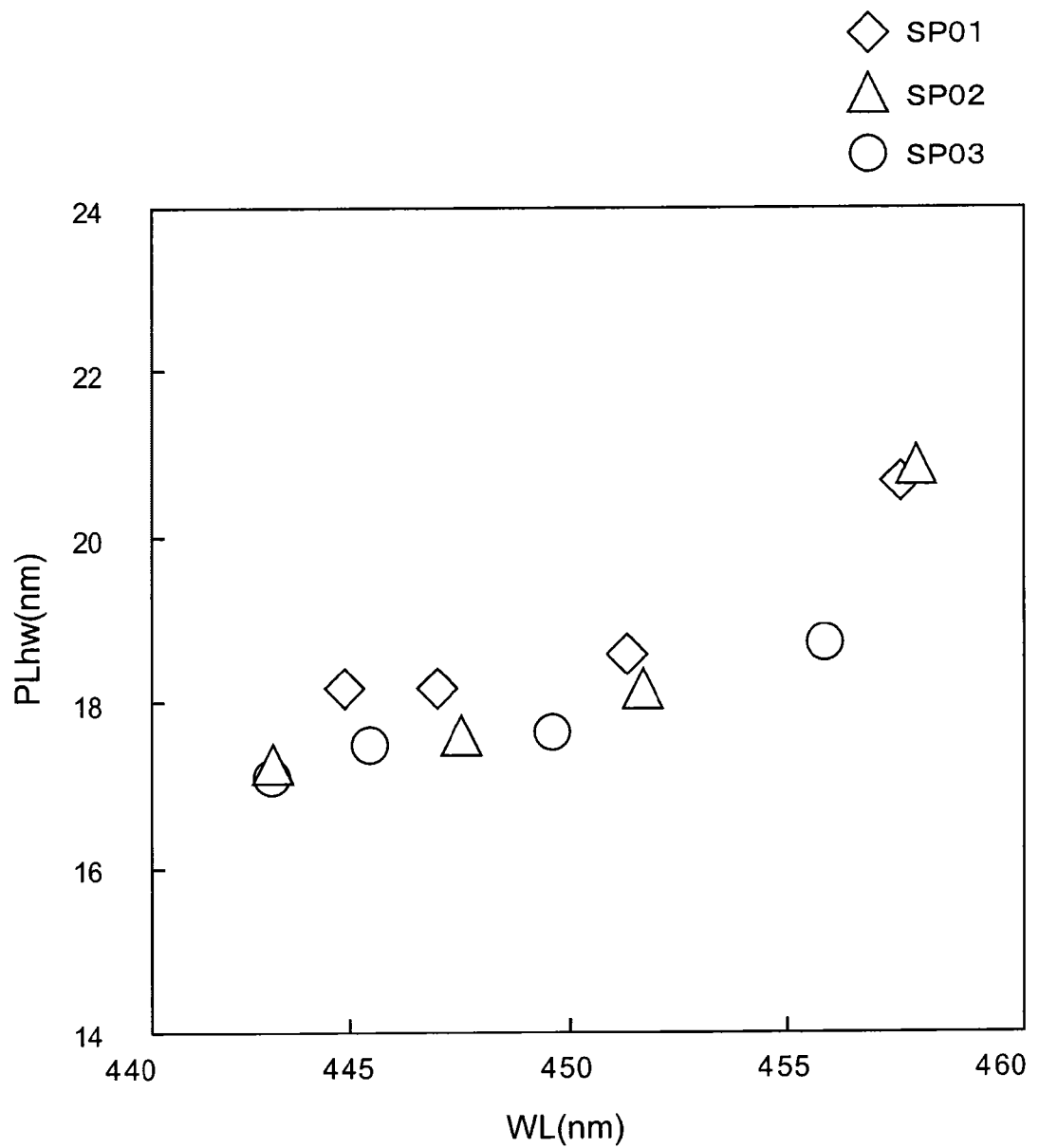
FIG. 7 is a graph illustrating characteristics of a semiconductor light emitting device according to the embodiment.
Figure 8:
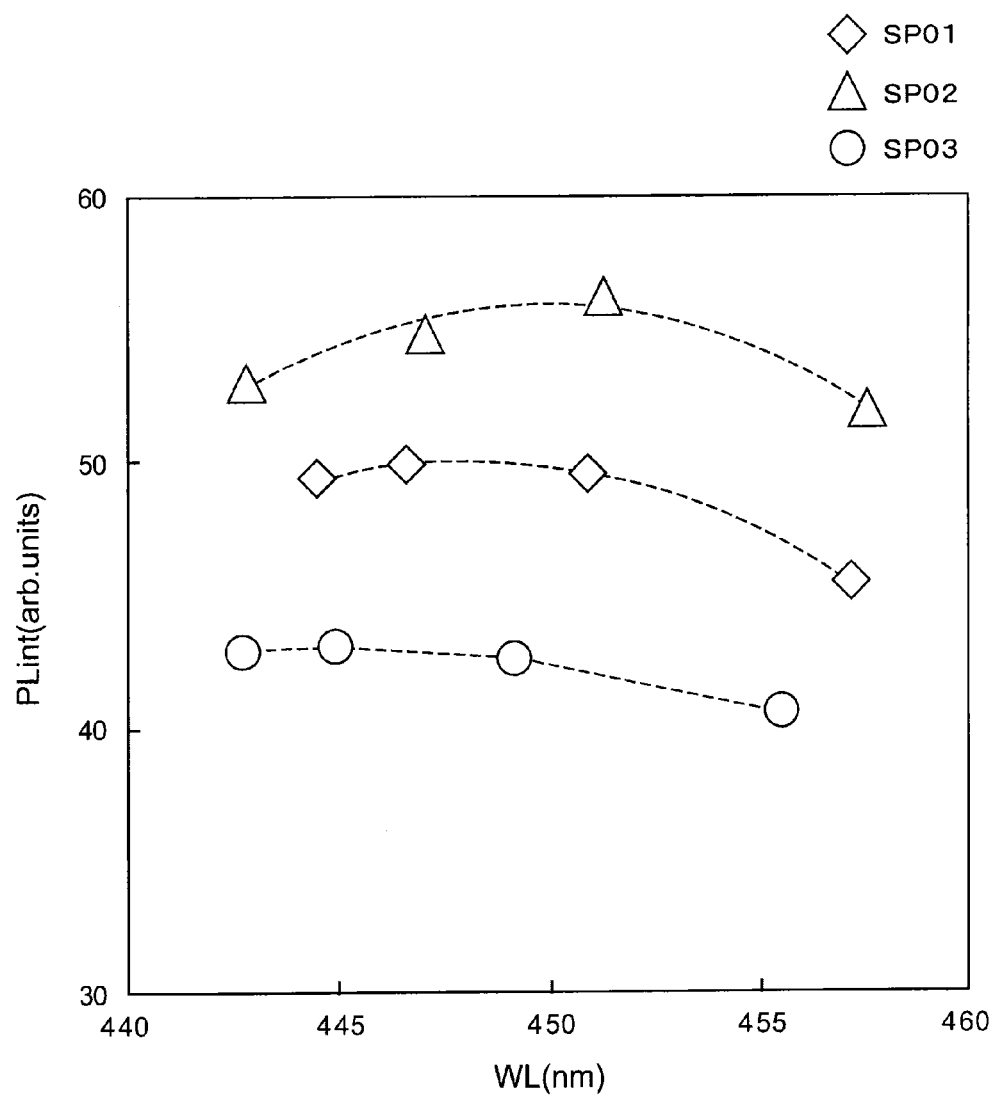
FIG. 8 is a graph illustrating characteristics of a semiconductor light emitting device according to the embodiment.

FIG. 7 and FIG. 8 are graphs illustrating characteristics of semiconductor light emitting devices.

The horizontal axis of FIG. 7 is the PL peak wavelength WL (nm), and the vertical axis is the PL half width PLhw (nm).

The horizontal axis of FIG. 8 is the PL peak wavelength WL (nm), and the vertical axis is the peak integrated intensity PLint (arbitrary unit).

As shown in FIG. 7, the PL half width to the PL peak wavelength changes to follow almost the same values for all of the first sample SP01 to the third sample SP03.

As shown in FIG. 8, the integrated intensity of the first sample SP01 is stronger than the integrated intensity of the third sample SP03. The integrated intensity of the second sample SP02 is still stronger than the integrated intensity of the first sample SP01. The integrated intensity of the first sample SP01 is weaker than the integrated intensity of the second sample SP02, as shown in FIG. 6A, it is thought to be due to the In composition ratio IC being not steady along the Z-axis direction.

Further, in the experiment, the surface of the well layer 34 is observed by the 3DAP method for each of the first sample SP01 to the third sample SP03. The root mean square (RMS) value of the interface fluctuation calculated from the In isoconcentration surface is investigated for the upper surface of the well layer 34 of each of the first sample SP01 to the third sample SP03.

Figure 9:
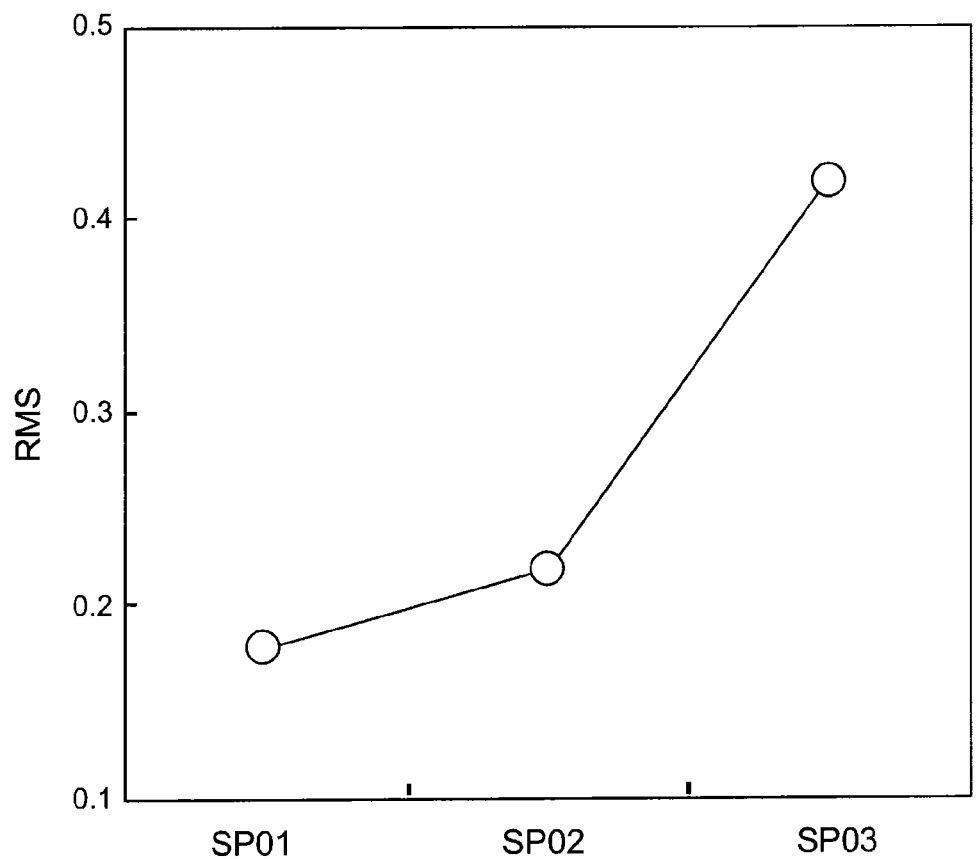
FIG. 9 is a graph illustrating characteristics of a semiconductor light emitting device according to the embodiment.

FIG. 9 is a graph illustrating characteristics of semiconductor light emitting devices.

FIG. 9 shows the RMS value of each of the first sample SP01 to the third sample SP03.

As shown in FIG. 9, the RMS value of the well layer 34 of the first sample SP01 is 0.18. The RMS value of the well layer 34 of the second sample SP02 is 0.22. The RMS value of the well layer 34 of the third sample SP03 is 0.42.

By the method for manufacturing the semiconductor light emitting device 110 according to the embodiment, the segregation of In can be suppressed as compared to the manufacturing method of the reference example. In the embodiment, a small amount of hydrogen is put in the carrier gas in the formation of the well layer 34. Hydrogen has an etching effect on InGaN. The suppression of the segregation of In in the well layer 34 is presumed to be due to the hydrogen in the carrier gas. For example, this is presumed to be because hydrogen has suppressed the occurrence of a portion where the concentration of In is high.

Also in the manufacturing method of the second example in which hydrogen is added only to the well layer 34, the segregation of In in the well layer 34 is suppressed as compared to the manufacturing method of the reference example in which hydrogen is not added. In the manufacturing method of the second example, the segregation of In in the well layer 34 can be still more suppressed than in the manufacturing method of the first example.

Furthermore, in the method for manufacturing the semiconductor light emitting device 110 according to the embodiment, the peak integrated intensity of PL can be improved as compared to the manufacturing method of the reference example. Furthermore, in the manufacturing method of the second example, the light emission efficiency can be more improved than in the manufacturing method of the first example. By suppressing the segregation of In of the well layer 34, the occurrence of a crystal defect in the well layer 34 can be suppressed. It is considered that the improvement in the peak integrated intensity in the embodiment is due to the suppression of the crystal defect of the well layer 34.

Moreover, from the investigation of the RMS value, the flatness of the well layer 34 of the first sample SP01 is higher than the flatness of the well layer 34 of the third sample SP03. The flatness of the well layer 34 of the second sample SP02 was approximately equal to the flatness of the well layer 34 of the first sample SP01. This is presumed to be because the formation of a cluster (protrusion) and the like are suppressed by the addition of hydrogen in forming the well layer 34. By improving the flatness of the well layer 34, for example, the light emission efficiency of the semiconductor light emitting device 110 can be further improved.

As described above, hydrogen has an etching effect on an InGaN layer. For example, when an InGaN layer is grown in an environment with a large amount of hydrogen, the desorption of indium is promoted, and a desired indium concentration (e.g. 10%) is not obtained. Hence, conventionally the formation of the well layer 34 including $In_\alpha Ga_{1-\alpha}N$ has been performed in a nitride atmosphere using only nitrogen as the carrier gas.

The inventor of this application has conducted intensive studies on the relationship between the formation of the well layer 34 and the amount of hydrogen, and has found that the segregation of In can be suppressed to improve the crystallinity of the well layer 34 by adding a small amount of hydrogen to the carrier gas used in forming the well layer 34. This is a new effect found through the experiment by the inventor of this application.

Specifically, as mentioned above, the flow rate of hydrogen included in the carrier gas is set not less than 0.07% and not more than 0.15% of the total flow rate when forming the well layer 34. Thereby, the segregation of In can be suppressed, and the crystallinity of the well layer 34 can be improved.

Figure 10:
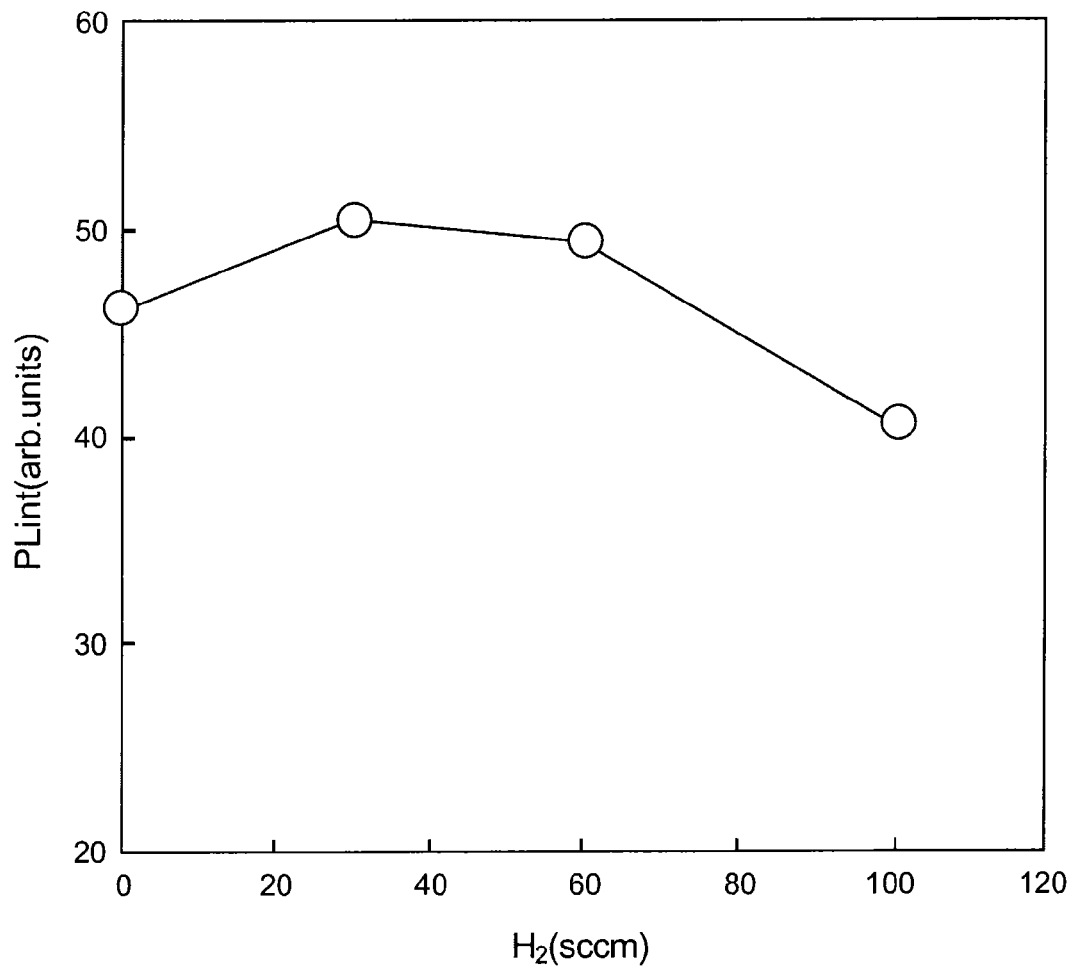
FIG. 10 is a graph illustrating characteristics of a semiconductor light emitting device according to the embodiment.

FIG. 10 is a graph illustrating characteristics of the semiconductor light emitting device.

The horizontal axis of FIG. 10 is the flow rate (sccm) of hydrogen in forming the well layer 34, and the vertical axis is the PL peak integrated intensity (arbitrary unit) of the semiconductor light emitting device 110 obtained.

As shown in FIG. 10, in a range of the flow rate of hydrogen of not less than 30 sccm and not more than 60 sccm, the PL peak integrated intensity is substantially the same. In contrast, in the case where the flow rate of hydrogen is set to 100 sccm, the PL peak integrated intensity is reduced as compared to the case where the flow rate of hydrogen is set to 60 sccm. Thus, when the flow rate of hydrogen is smaller than 30 sccm (i.e. smaller than 0.07% of the total flow rate), the effect of suppressing the segregation of In is weakened. Conversely, when the flow rate of hydrogen is larger than 60 sccm (0.15%), the effect is not limited to the suppression of the segregation of In, and the well layer 34 may be decomposed. For example, the well layer 34 itself is lost.

The growth temperature of the well layer 34 is set not less than 550° C. and not more than 900° C. If the growth temperature of the well layer 34 is lower than 550° C., the decomposition efficiency of $NH_3$ is significantly reduced and droplets are likely to occur. If the growth temperature of the well layer 34 is higher than 900° C., the crystal growth of InGaN is difficult due to thermal decomposition. The growth temperature of the well layer 34 is preferably set not less than 700° C. and not more than 850° C. Thereby, a light emission wavelength of blue color or green color can be appropriately obtained.

The growth temperature of the first barrier layer 31 is set not less than 800° C. and not more than 1200° C. The growth temperature of the first barrier layer 31 is preferably set not less than 850° C. and not more than 950° C. In this range of temperature, the growth temperature of the first barrier layer 31 is set higher than the growth temperature of the well layer 34 by 50° C. or more. Thereby, it becomes easy to obtain good crystal quality in the first barrier layer 31 and the well layer 34. If the growth temperature of the first barrier layer 31 is lower than 800° C., a pit expands during growth, and it becomes difficult to obtain a flat film. If the growth temperature of the first barrier layer 31 is higher than 950° C., it takes a long time to increase the temperature. Furthermore, the crystal quality of the well layer 34 is degraded by decomposition etc. Temperatures higher than 1200° C. are beyond the decomposition temperature of the first buffer layer 51 and the first semiconductor layer 10, and are not preferable as the crystal growth temperature. The first barrier layer 31 to the third barrier layer 33 need only to be a nitride semiconductor layer with a band gap higher than that of the well layer 34, and may include an impurity. The first barrier layer 31 to the third barrier layer 33 are preferably a GaN layer. Thereby, the crystal quality of the first barrier layer 31 to the third barrier layer 33 can be enhanced, and also the crystal growth of the first barrier layer 31 to the third barrier layer 33 becomes easy.

Before the formation of the well layer 34, the second barrier layer 32 including a GaN layer is formed at substantially the same growth temperature as that of the well layer 34. That is, the absolute value of the difference between the growth temperature of the well layer 34 and the growth temperature of the second barrier layer 32 is smaller than the absolute value of the difference between the growth temperature of the first barrier layer 31 and the growth temperature of the second barrier layer 32. Thereby, the quality of the well layer 34 can be more enhanced. Further, after the formation of the well layer 34, the third barrier layer 33 including a GaN layer is formed at substantially the same growth temperature as that of the well layer 34. That is, the absolute value of the difference between the growth temperature of the well layer 34 and the growth temperature of the third barrier layer 33 is smaller than the absolute value of the difference between the growth temperature of the first barrier layer 31 and the growth temperature of the second barrier layer 32. Thereby, the decomposition of the well layer 34 can be suppressed, and the quality of the well layer 34 can be more enhanced.

By suppressing the segregation of In of the well layer 34, the well layer 34 can be made thick. The thickness of the well layer 34 is, for example, not less than 1 nm and not more than 10 nm. A preferable thickness of the well layer 34 is, for example, not less than 4 nm and not more than 8 nm. The thickness of the well layer 34 may be varied between stacked units 35.

The thickness of the first barrier layer 31 is set to 10 nm or less. If the thickness of the first barrier layer 31 is larger than 10 nm, a limitation is imposed on the design of the multiquantum well structure of the light emitting layer 30.

The segregation of In of the well layer 34 can be suppressed also in the case where a small amount of hydrogen is put in the carrier gas when forming the first barrier layer 31 on the well layer 34. Specifically, the flow rate of hydrogen in the growth of the first barrier layer 31 is set not less than 0.2% and not more than 3% of the total flow rate. If it is smaller than 0.2%, the effect of suppressing the segregation of In is weakened. Conversely, if it is larger than 3%, the effect is not limited to the suppression of the segregation of In, and the well layer 34 may be decomposed. By adding hydrogen only in the formation of the well layer 34 without adding hydrogen in the formation of the first barrier layer 31, the segregation of In can be suppressed more appropriately, and the crystal quality of the well layer 34 can be more improved.

Figure 11:
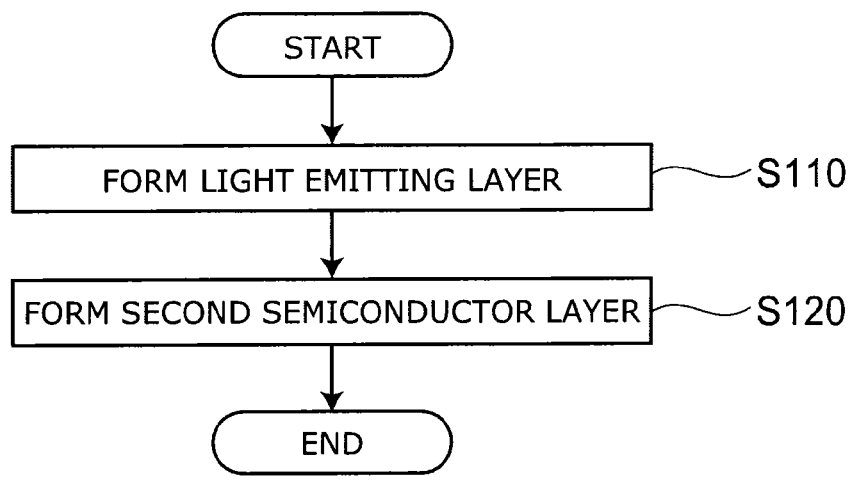
FIG. 11 is a flow chart illustrating a method for manufacturing a semiconductor light emitting device according to the embodiment.

FIG. 11 is a flow chart illustrating a method for manufacturing a semiconductor light emitting device according to the embodiment.

As shown in FIG. 11, the method for manufacturing a semiconductor light emitting device according to the embodiment includes step S110 that forms the light emitting layer 30 and step S120 that forms the second semiconductor layer 20.

Step S110 that forms the light emitting layer 30 includes forming the well layer 34 and forming the first barrier layer 31.

Thereby, the semiconductor light emitting device 110 in which the segregation of In in the well layer 34 is suppressed is manufactured.

Although the well layer 34 is illustrated as the nitride semiconductor layer including In in the embodiment mentioned above, also a plurality of second layers 42 included in the stacked film 40 are possible, for example. That is, the second layer 42 of the stacked film 40 may be used as the first nitride semiconductor layer, and the first layer 41 may be used as the second nitride semiconductor layer. Furthermore, the nitride semiconductor layer including In is not limited to an InGaN layer, and for example, an InN layer, an Inelegant layer, and the like may be used. Thus, the method for manufacturing a semiconductor light emitting device according to the embodiment can be used also as a method for manufacturing other nitride semiconductor layers including In.

The embodiment provides a method for manufacturing a nitride semiconductor layer of high crystal quality and a method for manufacturing a semiconductor light emitting device of high crystal quality.

In the specification, "nitride semiconductor" includes all semiconductors expressed by the chemical formula of $B_xIn_yAl_zGa_{1-x-y-z}N$ ($0 \le x \le 1$, $0 \le y \le 1$, $0 \le z \le 1$, $x+y+z \le 1$) in which the composition ratios x, y, and z are changed in the respective ranges. Furthermore, in the chemical formula mentioned above, also those further including a group V element other than N (nitrogen), those further including various elements added in order to control various properties such as the conductivity type, and those further including various elements unintentionally included are included in the "nitride semiconductor."

In the specification of this application, "perpendicular" and "parallel" refer to not only strictly perpendicular and strictly parallel but also include, for example, the variation due to manufacturing processes, etc. It is sufficient to be substantially perpendicular and substantially parallel. In the specification of this application, the state of being "provided on" includes not only the state of being provided in direct contact but also the state of being provided via another component. The state of being "stacked" includes not only the state of being stacked in contact with one another but also the state of being stacked via another component. The state of being "opposed" includes not only the state of facing directly but also the state of facing via another component.

Hereinabove, embodiments of the invention are described with reference to specific examples. However, the embodiment of the invention is not limited to these specific examples. For example, one skilled in the art may appropriately select specific configurations of components of nitride semiconductor layers and semiconductor light emitting devices such as substrates, first nitride semiconductor layers, second nitride semiconductor layers, first semiconductor layers, light emitting layers, well layers, barrier layers, and second semiconductor layers from known art and similarly practice the invention. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all methods for manufacturing nitride semiconductor layer, and methods for manufacturing semiconductor light emitting device practicable by an appropriate design modification by one skilled in the art based on the methods for manufacturing nitride semiconductor layer, and methods for manufacturing semiconductor light emitting device described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a nitride semiconductor layer, the method comprising:
    forming a first nitride semiconductor layer on a substrate in a reactor supplied with a first carrier gas and a first source gas, the first nitride semiconductor layer including indium, the first carrier gas including hydrogen being supplied into the reactor at a first flow rate and including nitrogen being supplied into the reactor at a second flow rate, the first source gas including indium and nitrogen being supplied into the reactor at a third flow rate;
    the first flow rate being not less than 0.07% and not more than 0.15% of a sum of the first flow rate, the second flow rate, and the third flow rate.

2. The method according to claim 1, wherein
    the first source gas further includes gallium, and
    the first nitride semiconductor layer includes $In_\alpha Ga_{1-\alpha}N$ ($0<\alpha<1$).

3. The method according to claim 2, wherein the $\alpha$ is not less than 0.1 and not more than 0.2.

4. The method according to claim 2,
    further comprising forming a second nitride semiconductor layer on the first nitride semiconductor layer in the reactor supplied with a second carrier gas and a second source gas, the second nitride semiconductor layer including $In_{\beta 1}Ga_{1-\beta 1}N$ ($0\le\beta 1<1$, $\beta 1<\alpha$), the second carrier gas including hydrogen being supplied into the reactor at a fourth flow rate and including nitrogen being supplied into the reactor at a fifth flow rate, the second source gas including gallium and nitrogen being supplied into the reactor at a sixth flow rate,
    the fourth flow rate being not less than 0.2% and not more than 3% of a sum of the fourth flow rate, the fifth flow rate, and the sixth flow rate.

5. The method according to claim 4, wherein the $\beta 1$ is 0.1 or less.

6. The method according to claim 4, wherein a thickness of the second nitride semiconductor layer is not less than 4 nm and not more than 10 nm.

7. The method according to claim 2,
    further comprising forming a second nitride semiconductor layer on the first nitride semiconductor layer,
    the second nitride semiconductor layer including $In_{\beta 1}Ga_{1-\beta 1}N$ ($0\le\beta 1<1$, $\beta 1<\alpha$),
    the forming the second nitride semiconductor layer including forming the second nitride semiconductor layer by a second carrier gas and a second source gas, the second carrier gas including nitrogen, the second source gas including gallium and nitrogen,
    an amount of hydrogen per unit volume included in the second carrier gas being smaller than an amount of hydrogen per unit volume included in the first carrier gas.

8. The method according to claim 7, wherein the amount of hydrogen per unit volume included in the second carrier gas is $1/10000$ or less of the amount of hydrogen per unit volume included in the first carrier gas.

9. The method according to claim 1, wherein a thickness of the first nitride semiconductor layer is not less than 4 nm and not more than 8 nm.

10. The method according to claim 1, wherein a ratio of group III elements included in the first source gas to group V elements included in the first source gas is not less than 20,000 and not more than 30,000.

11. A method for manufacturing a semiconductor light emitting device, the method comprising:
    forming a light emitting layer on a first semiconductor layer of a first conductivity type in a reactor, the first semiconductor layer including a nitride semiconductor,
    the forming the light emitting layer including forming a stacked unit, the stacked unit including a well layer and a first barrier layer, the well layer including $In_\alpha Ga_{1-\alpha}N$ ($0<\alpha<1$), the first barrier layer including $In_{\beta 1}Ga_{1-\beta 1}N$ ($0\le\beta 1<1$, $\beta 1<\alpha$),
    the forming the stacked unit including forming the well layer by a first carrier gas and a first source gas, the first carrier gas including hydrogen being supplied into the reactor at a first flow rate and including nitrogen being supplied into the reactor at a second flow rate, the first source gas including indium, gallium, and nitrogen being supplied into the reactor at a third flow rate,
    the first flow rate being not less than 0.07% and not more than 0.15% of a sum of the first flow rate, the second flow rate, and the third flow rate; and
    forming a second semiconductor layer on the light emitting layer, the second semiconductor layer being of a second conductivity type and including a nitride semiconductor.

12. The method according to claim 11, wherein
    the forming the first barrier layer includes forming the first barrier layer by a second carrier gas and a second source gas, the second carrier gas including hydrogen being supplied into the reactor at a fourth flow rate and including nitrogen being supplied into the reactor at a fifth flow rate, the second source gas including at least gallium and nitrogen being supplied into the reactor at a sixth flow rate and
    the fourth flow rate is not less than 0.2% and not more than 3% of a sum of the fourth flow rate, the fifth flow rate, and the sixth flow rate.

13. The method according to claim 11, wherein the forming the light emitting layer includes performing the forming the stacked unit multiple times.

14. The method according to claim 11, wherein a temperature of the forming the second semiconductor layer is higher than a temperature of the forming the well layer.

15. The method according to claim 11, wherein
    the forming the second semiconductor layer includes:
        forming a first layer of a p type on the light emitting layer;
        forming a second layer of a p type on the first layer; and
        forming a third layer of a p type on the second layer, a concentration of a p-type impurity in the second layer is lower than a concentration of a p-type impurity of the third layer, and a lattice constant of the first layer is lower than a lattice constant of the second layer.

16. The method according to claim 11, wherein a temperature of the forming the first barrier layer is higher than a temperature of the forming the well layer.

17. The method according to claim 16, wherein the temperature of the forming the well layer is not less than 550° C. and not more than 900° C.

18. The method according to claim 17, wherein
the temperature of the forming the first barrier layer is not less than 800° C. and not more than 1200° C. and
an absolute value of a difference between the temperature of the forming the first barrier layer and the temperature of the forming the well layer is 50° C. or more.

19. The method according to claim 16, wherein
the stacked unit further includes a second barrier layer provided between the first barrier layer and the well layer and including $In_{\beta2}Ga_{1-\beta2}N$ ($0 \le \beta2 < 1$, $\beta2 < \alpha$), and the first barrier layer is disposed between the first semiconductor layer and the well layer,
the forming the stacked unit further includes forming the second barrier layer after the forming the first barrier layer,
forming the well layer is performed after the forming the second barrier layer, and
an absolute value of a difference between a temperature of the forming the well layer and a temperature of the forming the second barrier layer is smaller than an absolute value of a difference between a temperature of the forming the first barrier layer and the temperature of the forming the second barrier layer.

20. The method according to claim 16, wherein
the stacked unit further includes a third barrier layer including $In_{\beta3}Ga_{1-\beta3}N$ ($0 \le \beta3 < 1$, $\beta3 < \alpha$), and the well layer is disposed between the first barrier layer and the third barrier layer,
the forming the well layer is performed after the forming the first barrier layer,
the forming the stacked unit further includes forming the third barrier layer after the forming the well layer, and
an absolute value of a difference between a temperature of the forming the well layer and a temperature of the forming the third barrier layer is smaller than an absolute value of a difference between a temperature of the forming the first barrier layer and the temperature of the forming the third barrier layer.

21. The method according to claim 1, further comprising:
forming a second nitride semiconductor layer in the reactor supplied with a second carrier gas and a second source gas, the second carrier gas including hydrogen being supplied into the reactor at a fourth flow rate and including nitrogen being supplied into the reactor at a fifth flow rate, the second source gas including gallium and nitrogen being supplied into the reactor at a sixth flow rate; and
forming a third nitride semiconductor layer on the second nitride semiconductor layer in the reactor supplied with a third carrier gas and a third source gas, the third carrier gas including hydrogen being supplied into the reactor at a seventh flow rate and including nitrogen being supplied into the reactor at an eighth flow rate, the third source gas including gallium and nitrogen being supplied into the reactor at a ninth flow rate,
the forming the first nitride semiconductor layer including forming the first nitride semiconductor layer on the third nitride semiconductor layer,
a ratio of the fourth flow rate to a sum of the fourth flow rate, the fifth flow rate, and the sixth flow rate being higher than a ratio of the first flow rate to a sum of the first flow rate, the second flow rate, and the third flow rate,
a ratio of the seventh flow rate to a sum of the seventh flow rate, the eighth flow rate, and the ninth flow rate being lower than the ratio of the fourth flow rate to the sum of the fourth flow rate, the fifth flow rate,
a temperature of the forming the second nitride semiconductor layer being higher than a temperature of the forming the first nitride semiconductor layer, and
a temperature of the forming the third nitride semiconductor layer being lower than the temperature of the forming the second nitride semiconductor layer.

22. The method according to claim 11, wherein
the forming the light emitting layer comprises:
forming the first barrier layer on the first semiconductor layer;
forming the second barrier layer on the first barrier layer; and
forming the well layer on the second barrier layer,
the forming the first barrier layer includes forming the first barrier layer by a second carrier gas and a second source gas, the second carrier gas including hydrogen being supplied into the reactor at a fourth flow rate and including nitrogen being supplied into the reactor at a fifth flow rate, the second source gas including at least gallium and nitrogen being supplied into the reactor at a sixth flow rate,
the fourth flow rate is not less than 0.2% and not more than 3% of a sum of the fourth flow rate, the fifth flow rate, and the sixth flow rate,
the forming the second barrier layer includes forming the second barrier layer by a third carrier gas and a third source gas, the third carrier gas including hydrogen being supplied into the reactor at a seventh flow rate and including nitrogen being supplied into the reactor at an eighth flow rate, the third source gas including gallium and nitrogen being supplied into the reactor at a ninth flow rate,
a ratio of the fourth flow rate to a sum of the fourth flow rate, the fifth flow rate, and the sixth flow rate is higher than a ratio of the first flow rate to a sum of the first flow rate, the second flow rate, and the third flow rate,
a ratio of the seventh flow rate to a sum of the seventh flow rate, the eighth flow rate, and the ninth flow rate is lower than the ratio of the fourth flow rate to the sum of the fourth flow rate, the fifth flow rate,
a temperature of the forming the first barrier layer is higher than a temperature of the forming the well layer, and
a temperature of the forming the second barrier layer is lower than the temperature of the forming the first barrier layer.

* * * * *